United States Patent [19]

Firmstone et al.

[11] Patent Number: 5,059,242
[45] Date of Patent: Oct. 22, 1991

[54] SEED LAYER COMPOSITIONS CONTAINING ORGANOGOLD AND ORGANOSILVER COMPOUNDS

[76] Inventors: Michael G. Firmstone; Andrew Lindley, both of Manor Park, Runcorn, Cheshire, England

[21] Appl. No.: 516,080

[22] Filed: Apr. 27, 1990

[51] Int. Cl.$^5$ .............................................. C23C 18/08
[52] U.S. Cl. .................................. 106/1.23; 106/1.18; 252/514; 427/126.5
[58] Field of Search ...................... 106/1.18, 1.19, 1.23, 106/1.25, 1.26; 252/514; 427/126.5, 419.8, 376.7, 216

[56] References Cited

U.S. PATENT DOCUMENTS

| | | | |
|---|---|---|---|
| 3,313,632 | 4/1967 | Langley et al. | 106/1.23 |
| 3,887,383 | 6/1975 | Nesteruk | 106/1.23 |
| 4,230,493 | 10/1980 | Felten | 106/1.18 |

FOREIGN PATENT DOCUMENTS

| | | | |
|---|---|---|---|
| 2252813 | 5/1973 | Fed. Rep. of Germany | 106/1.23 |
| 934182 | 8/1963 | United Kingdom | 106/1.23 |
| 998830 | 7/1965 | United Kingdom | 106/1.23 |
| 1009539 | 11/1965 | United Kingdom | 106/1.23 |
| 1016118 | 1/1966 | United Kingdom | 106/1.23 |
| 1155111 | 6/1969 | United Kingdom | 106/1.23 |
| 1251451 | 10/1971 | United Kingdom | 106/1.23 |
| 1414500 | 11/1975 | United Kingdom | 106/1.23 |
| 2068414 | 8/1981 | United Kingdom | 106/1.23 |
| 2131833 | 6/1984 | United Kingdom | 106/1.23 |

Primary Examiner—William R. Dixon, Jr.
Assistant Examiner—Paul Marcantoni
Attorney, Agent, or Firm—Morgan & Finnegan

[57] ABSTRACT

A fluid composition for producing a gold seed layer on a substrate for an electrical circuit, which comprises an organogold and an organosliver compound present as 0.5 to 10 parts by weight silver per 100 parts by weight gold. In preferred compositions the silver is present as 0.8 to 6 parts by weight per 100 parts gold. The process improves seed layer to substrate adhesion.

10 Claims, 1 Drawing Sheet

SEED LAYER COMPOSITIONS CONTAINING ORGANOGOLD AND ORGANOSILVER COMPOUNDS

The present invention relates to fluid compositions for the production of seed layers which promote the adhesion of metal circuit elements to substrates.

It is known to use a seed layer of substantially one inert metal to promote the adhesion of metal elements of a high density electrical circuit to a substrate, for example that of copper tracks to a ceramic substrate. Such layers may consist of gold containing traces (<2% w/w) of metals such as bismuth and rhodium, and minute traces of metals such as platinum and silver. It also is known to produce such seed layers by applying a fluid composition comprising an organogold compound, organic compounds of the trace metals, a resin derivative and a fluid vehicle to a substrate in a desired pattern, e.g. by screen printing, and then firing the coated substrate to thermally decompose the composition and produce a seed layer of gold in a corresponding pattern adhering to the substrate.

Conventional seed layers so produced tend to suffer from disadvantageous shortcomings in their physical properties. One disadvantage of such conventional seed layers is that the adhesion between the layer and the substrate tends to weaken drastically, well within the operational lifetime of the circuit, after use at typical moderately elevated operating temperatures. This effect may be so pronounced that a track and its seed layer easily may be peeled from a substrate as a cohesive whole.

Surprisingly, we have found that it is possible to provide a composition which confers particularly good physical properties on a seed layer which is produced from it upon a substrate.

In particular, such a composition is capable of producing a seed layer which does not suffer from the above disadvantageous weakening to the same extent.

In a first aspect this invention provides a fluid composition comprising an organogold compound characterized in that the composition further comprises an organosilver compound present in an amount equal to 0.5 to 10 parts by weight silver per 100 parts by weight gold. The fluid composition also may contain organic compounds of trace metals, said trace metals usually being less than 2% by weight of the weight of gold, a resin derivative, and optionally contain a fluid vehicle. The fluid composition is suitable for coating a glass, glass-ceramic or ceramic substrate and capable of producing a gold seed layer thereon by firing the coated substrate to thermally decompose the composition. In preferred compositions the silver is present as 0.8 to 6 parts by weight silver per 100 parts gold.

Apart from the silver content, the composition of the present invention may be entirely conventional. When fired on a substrate surface as described hereinafter, compositions of the present invention each produce a seed layer which has especially good adhesion to the subtrate and is capable of good adhesion to any metal conventionally used for circuit conductor tracks which may be subsequently applied to it in particular to copper or gold, in particular to copper. Compositions specifically disclosed herein have especially good properties of this type.

As is conventional, the composition will generally comprise a resin or polymer in addition to the metal compounds. The molecular weight of the compounds and/or the resin or polymer may be sufficiently low that the relevant component is a fluid (i.e., a liquid or gel) at ambient temperatures and then may act as a fluid vehicle for the composition. However, this is often conventionally not the case, and the composition will then additionally comprise a fluid organic vehicle as a fluid matrix for the other composition components. It is especially preferred that all such composition components are mutually soluble.

Compositions in which all the components are mutually soluble tend to have advantageous homogeneity giving rise to seed layers with the enhanced desired physical properties.

In the present composition, the compounds, resin or polymer and optional vehicle should be chosen to have good mutual compatibility, and good compatibility with any inorganic substrate to be coated with the present composition. The components of the compositions specifically disclosed herein and the compositions specifically disclosed herein have such good mutual compatibility.

The same present compositions and component compounds, resins or polymers and vehicles also appear to have not only the necessary compatibility with different substrate materials but to be versatile with a wide range of such materials. As described further hereinafter, one class of materials which may suitably be comprised in a substrate surface comprises ceramics, glasses or glass-ceramics. Another suitable class comprises high-melting plastics.

Within the above general guidelines and those given hereinafter, suitable compositions, and component compounds, resins or polymers and optional vehicles may be established by routine trial.

The exact nature of the organosilver compound within the present coating composition is immaterial, provided it fulfills the compatibility criteria also laid down hereinbefore.

One such class is that in which a silver moiety is bound (generally via a thio, polythio or carboxylate bridge) to a hydrocarbon moiety. Preferably the hydrocarbon moiety is a fairly large hydrocarbon moiety, e.g., a $C_{8-40}$ hydrocarbon, such as a $C_{8-16}$ hydrocarbon.

To enhance the desired mutual compatibility and/or solubility of the composition components such hydrocarbons tend to be heavily branched and/or to contain a (poly)cyclic structure, in addition to being fairly large. They also may be unsaturated.

One sub-class of such compounds comprises silver sulphoresinates, silver terpene sulphides, also known as silver terpene mercaptides, and aryl mercaptides of silver. Preferred aryl moieties are as described above for this class of compounds.

Another suitable sub-class comprises alkanoates of silver, in particular heavily branched long-chain alkanoates of silver, especially those where the carboxylate function is attached to a secondary or tertiary carbon atom, in particular a tertiary carbon atom, such as $C_{8-16}$ tert.-alkanoates, e.g., silver neodecanoate. Such alkanoate moieties will tend to exist as molecular weight cuts in which, e.g., in the decanoyl moiety the decanoyl fraction will predominate but where nonanoyl and undecanoyl fractions will be present. Similarly, the neodecanoyl moiety will tend to predominate, but other isomers will be present.

From the foregoing it will be seen that one suitable class of such compounds comprises silver sulphoresinate and silver neodecanoate.

The exact nature of the organogold compound within the present coating composition is immaterial, provided it fulfills the compatibility criteria also laid down hereinbefore.

One such class is that in which a gold (I) moiety is bound (generally via a thio or polythio bridge) to a hydrocarbon moiety.

Preferably the hydrocarbon moiety is a fairly large hydrocarbon moiety, e.g., a $C_{8-40}$ hydrocarbon, such as a $C_{8-16}$ hydrocarbon, since this tends to enhance the desired mutual compatibility and/or solubility of the composition components.

For the same reason, such hydrocarbons tend to be heavily branched and/or to contain a (poly)cyclic structure. They also may be unsaturated.

From the foregoing it will be seen that one suitable sub-class of such compounds comprises gold (I) terpene sulphides, also known as gold terpene mercaptides.

Examples of gold terpene sulphides include gold dipentene sulphide, and in particular gold sulphides of (poly)cyclic terpenes, such as gold alpha-pinene sulphide, gold beta-pinene sulphide, gold terpinolene sulphide, gold menthene sulphide, gold camphene sulphide and gold $\Delta^3$-carene sulphide.

This sub-class also includes the gold mercaptides of alpha-thioterpineol, beta-thioterpineol and thioborneol.

It will also similarly be seen that another suitable subclass comprises alkyl mercaptides of gold, in particular heavily branched long-chain alkyl mercaptides of gold, especially those where the mercapto function is attached to a secondary or tertiary carbon atom, in particular a tertiary carbon atom, such as $C_{8-16}$ tert.-alkyl or $C_{12-16}$ tert.-alkyl mercaptides, e.g., gold tert.-dodecyl, -tetradecyl and hexadecyl mercaptides. Such alkyl moieties will tend to exist as molecular weight cuts in which, e.g., in the dodecyl moiety, the dodecyl fraction will predominate but where undecyl and tridecyl fractions will be present.

Where the alkyl moiety is dodecyl, the predominant dodecyl fraction tends to be obtained in known preparations as a mixture of isomers, of which the 2,2,4,6,6-pentamethylhept-4-yl (2,2-bisneopentylethyl) and 2,4,4,6,6-pentamethyl-hept-2-yl isomeric materials are believed to predominate.

A third suitable sub-class of such compounds comprises aryl mercaptides of gold (I). Preferred aryl moieties are as described above for this class of hydrocarbons.

Another suitable class of such compounds includes gold (III) complexes with organic acid anions, such as alkanoic acid anions and/or nitrogenous bases, such as aromatic base anions. This class comprises compounds such as bis(2-ethyl-4-methyl-imidazolyl)-tetrakis-(2-ethylhexanoato)digold (III).

A third suitable class of compounds includes those in which a gold (I) moiety is bound (generally directly) to a C or N atom of a heterocyclic moiety, such as pyrid-2-ylgold (I) and 1,2,4-triazolylgold (I).

Particularly useful compounds include gold tert.-dodecylmercaptide.

In one class of the present compositions, the gold compound will have a thermal decomposition temperature at least 200° C. below that of the resin or polymer, and preferably at least 250° C. below. (The term "decomposition temperature" herein means the relevant point of a relevant TGA trace at which 90% weight loss of the total organics in the material has occurred, all such TGA traces being determined under as near identical conditions as possible). It will be appreciated that the relevant decomposition temperatures will be those determined in air, since the present compositions are mainly provided for air-firing applications.

However, the relevant heating or firing of the composition and substrate may in some instances be carried out in an inert atmosphere such as nitrogen where the decomposition temperature will tend to be higher than in air.

The metal compounds suitably each have a decomposition temperature in any medium in the range of 100° to 350° C., favorably at least 200° C. below, and preferably at least 250° C. below, the decomposition temperature of the resin or polymer.

Suitable classes of compounds fulfilling the above criterion and which are compatible with the other composition components and the substrate materials are those named hereinbefore.

The exact nature of the resin or polymer within the coating composition of the first aspect of the present invention is immaterial, provided that it fulfills the compatibility criteria laid down hereinbefore.

From the foregoing it will be appreciated that within the scope of the term "resin or polymer" herein are included all types of natural resins and synthetic resins and resin derivatives. It will be appreciated that some synthetic resins will also be polymers. Also included within the scope of the term are all types of homo- and co- polymers, oligomers, polycondensates and oligocondensates.

A co-"polymer" may be of any type (e.g., random, block or graft). The resin derivative or polymer may be cross-linkable or cross-linked or neither, and may contain curing agents.

As with gold compound, the resin or polymer will seldom be a pure compound, but will often consist of a molecular weight out of a mixture of congeners.

Materials which may be used include rosin, colophony and asphalt (Gilsonite), and synthetic resins, such as thermosetting epoxy resins (e.g., the reaction product of epichlorhydrin and bisphenol A, together with curing agents) and acrylic resins. Other materials include cellulose derivatives, such as ethyl cellulose.

Preferably, the resin or polymer will have a thermal decomposition temperature at least 200° C. above that of the organometal compounds, and, preferably at least 250° C. above in the same ambient medium, but as noted for the compounds above the medium may vary.

The resin or polymer suitably has a decomposition temperature in any medium in the range of 150° to 1000° C., favorably in the range of 400° to 550° C.

One suitable class of resin or polymers which fulfills the above criterion for preferred resins or polymers and consists of materials compatible with the other composition components and the substrate materials named herein includes homopolymers of the following and mutual copolymers and copolymers thereof with aromatic vinylics such as styrene. (Some of these polymers may be synthetic resins): dienes, such as butadiene, isoprene, 1,5-cyclooctadiene, and mixtures thereof; colophony, rosin; and asphalts, such as Gilsonite.

Useful polymers include polydienes, such as poly(butadiene).

Particularly useful polymers include copolymers of these dienes with 1,5-cyclooctadiene, butadieneacrylonitrile copolymers, and with acrylics, and in particular with styrene.

Poly(butadienes) and butadiene - styrene copolymers, such as the Cariflex series (Shell) are amongst preferred polymers.

Another suitable class of resins or polymers includes polyaromatics such as polyphenylene. A further suitable class includes high melting or decomposition point polyamides including aromatic polyamides, and similar polyimides. A yet further suitable class includes other resins or polymers containing a polyaromatic backbone interrupted by ether, ketone and/or sulphone linkages, such as PEEK, PEK and PES supplied by ICI.

One suitable class of resins includes synthetic resins, such as thermosetting epoxy resins (e.g., the reaction product of epichlorhydrin and bisphenol A, together with curing agents) and acrylic resins.

The range of decomposition temperatures relative to the (known) decomposition temperatures of suitable organometallic compounds and the processing conditions described hereinafter clearly will tend to indicate to the skilled man further suitable and preferred resins or polymers.

The resin or polymer often also will be chosen for its ability (together with any vehicle) to confer a viscosity on the composition which is suitable for application to the substrate in a desired (retained) pattern, e.g., by screen printing, although this also may be achieved by the inclusion of conventional thickeners and thixotropes, e.g., other resins or polymers (as described further below).

If only the main resin or polymer is used to adjust the viscosity, this property will conveniently tend to be determined by the average molecular weight of the resin or polymer, in a manner known to the skilled artisan.

The seed layer composition when applied by screen printing suitably will have a viscosity in the range of 20 to 2000 ps, preferably 200 to 1000 ps, at 2.5 rpm.

For many types of the materials, it is preferred that the polymer is soluble in any vehicle present and/or the organogold compound (or vice versa). For these reasons, preferred polymers tend to be non-crosslinked.

The foregoing resins and polymers belong to known classes of materials. Most of the resins and polymers mentioned hereinbefore may be used alone as a composition component or as mixtures. A mixture of homologues often is used for convenience in adjusting the rheology of the composition.

The rheological parameters of the composition also will vary (in addition to varying with the molecular weight of the resin or polymer) in a manner evident to the skilled artisan with the amount of any fluid present in the composition, and hence with any optional organic vehicle which is present. A vehicle usually will be present in the composition of the present invention and is often a mixture of organic liquids.

Any such vehicle often will be chemically inert, and preferably should be of low toxicity. A fairly high boiling point or mixture of boiling points will tend to be desirable and significant in controlling the necessary removal of the vehicle from the composition on substrate during the early stages of any firing process. Boiling points in the range 150° to 250° C. are preferred.

Suitable vehicles include the following and compatible mixtures thereof; aromatics, such as xylene and high-boiling petroleum fractions, e.g., Aromasol H (ICI); substituted aromatics, such as nitrobenzene and o-nitrotoluene; aliphatics and essential oils, such as high-boiling petroleum fractions, terpenes, e.g., alpha- and beta-pinene, dipentene and dipentene oxide, and rosemary, lavender, fennel, sassafras, wintergreen and anise oils and camphor and turpentine; alcohols and alcohol mixtures such as isodecanol, butyl carbitol (Union Carbide), terpene alcohols, (such as alpha-terpineol, and alpha, beta-terpineol, cineol) and Cellosolve (Union Carbide); esters and ester mixtures, such as butyl carbitol acetate (Union Carbide), butyl oxalate, dibutyl phthalate, dibutyl benzoate and butyl Cellosolve acetate (Union Carbide).

Preferred vehicles or vehicle components include alpha-terpineol, butyl carbitol and Aromasol H.

However, vehicles comprising any of the foregoing materials may not adequately dissolve all the other composition components.

It may be necessary for improved solution of the compounds and/or resin or polymer to include other vehicle components which, although good solvents, are not favored since they have relatively low boiling points.

Example of such low boiling vehicles include chlorinated solvents such as dichloromethane, chloroform and carbon tetrachloride, ketones such as methyl ethyl ketone, esters such as ethyl, butyl and amyl acetates, alcohols such as isopropanol and butanol, aromatics such as toluene, and low boiling petroleum ethers, such as any $C_{5-8}$ cut.

In the compositions of the present invention the proportions of organogold compound to resin or polymer and to optional vehicle may vary, and may be optimized by routine trial to give desired physical properties of the composition.

Such desired properties may be, e.g., good coating and/or cohesive behavior of the product seed layer, e.g., the structure and surface properties of the gold within the layer.

The proportions of the gold compound in the composition may be 20 to 50%, e.g., 25 to 30% w/w, and that of the silver compound will be such that the silver is present at 0.5 to 10 parts by weight per 100 parts gold. The silver is preferably present as 0.8 to 6 parts by weight per 100 parts by weight of gold. The gold is generally present as 5 to 25, preferably 10 to 20% w/w of the composition.

Typically, both compounds will independently contain their respective metals at 15 to 55%, e.g., 25 to 55% w/w, so that (subject to the foregoing criterion) the silver compound will generally be present as 0.025 to 0.5% w/w, preferably 0.04 to 0.3% w/w. All of both metals will generally be released on thermal decomposition of their respective compounds.

The proportion of resin or polymer may be 1 to 55%, preferably 5 to 20% w/w, and that of the vehicle up to 50% 4 w/w.

Within the above ranges, the dispersibility in the vehicle of the solid components should be sufficient for them to be dispersed adequately and evenly. This parameter will clearly indicate to the skilled artisan preferred proportions for the above materials.

The present composition is generally provided for air-firing applications and will thus generally contain other components which are conventional in air-firing seed layer compositions, such as traces of organometallic compounds of other metals to improve the finish of the seed layer (included in the so-called gold fluxes).

Such materials may be compounds of the relevant metal with the type of organic moiety described for the gold and silver compounds hereinbefore or with rosin. Typical gold fluxes which may be present include bismuth flux (e.g., the so-called bismuth carboxylate, or the reaction product of bismuth subnitrate and rosin), generally at up to 7% w/w; rhodium flux or resinate (e.g., the so-called rhodium carboxylate, or the resinate; i.e., the reaction product of rhodium chloride and terpene sulphide) generally at up to 2% w/w; chromium flux (e.g., as a diketonate complex), generally at up to 1%, lead, cadmium, tin, copper, cobalt, antimony and vanadium fluxes (e.g., the reaction product of the relevant metal oxide with rosin), and silicon fluxes, each generally at up to 1% w/w; and palladium and platinum fluxes, generally at less than 0.1% w/w.

The present composition may contain other conventional components, such as thixotropes or viscosifying agents, such as cellulose acetate butyrate, nitrocellulose, Perchem XT (Perchem) and Thixatrol ST (NL Industries), generally at up to 10% w/w; anti-tack additives, such as white petroleum jelly and white mineral oil, dioctyl phthalate, safflower oil and silicone oil (generally at up to 10% w/w); flow aids, such as silicones and acrylics (e.g., Modaflow, Multiflow [Monsanto]), generally at up to 5% w/w; and visualization aids, such as solvent soluble dyes, e.g., Dispersal Red 4G-PC and Navy 5R-PC (ICI) (generally at up to 0.1% w/w).

In a second aspect, the present invention provides a process for the production of a composition of the present invention, comprising intimately mixing an organogold compound, an organosilver compound in such proportion that silver is present in the composition at 0.8 to 10 parts by weight per 100 parts gold, a resin or polymer, and optionally an organic fluid vehicle.

As described further in the Examples below, the mixing step may be carried out by conventionally blending the components, for example, by stirring, highshear mixing or mixing using a planetary vacuum mixer, or (for less mutually soluble components) by milling, e.g., using a ball-mill or multi-roll mill.

It may be helpful to apply some heat in the mixing process. In general, suitable temperatures may vary over a range which is not deleterious to any component, or evaporates it, but will typically be in the range of 15° to 65° C.; for example ambient temperatures are known to be suitable. Process times are typically in the range of 1 to 20 minutes.

The substrates for use in the invention may have any suitable form, and may have a wide variety of shapes and sizes. For example, they may be of the form described above in the specific description of the seed layer production process.

The substrate to which the present composition is applied may suitably be a ceramic, a glass or a glass-ceramic material which softens at a temperature higher than any firing temperature of the composition o of any fired component subsequently applied (e.g., an air-firing dielectric insulator).

Where the substrate is a ceramic it is preferably one selected from the group consisting of beryllia, alumina, zirconia, silica, aluminum nitride, silicon carbide, silicon nitride, strontium nitride, barium titanate, barium tetratitanate and barium zircotitanate.

Suitable glasses include respectively high-melting barium and lead borosilicate and aluminosilicate and other barium glasses and high-melting glass containing dissolved melt oxides. Suitable glass-ceramics include silicate glasses containing dispersed particulate ceramics as listed above.

The substrate may also suitably be a coating of one or more such materials on a ceramic sheet, for example, to a thickness in the range of 1 to 500 micron. Suitable sheet ceramics include those ceramics listed above.

Other mixtures of all the foregoing materials may be used.

The substrate may also suitably be a coating of one or more such materials on a metal sheet, for example to a thickness in the range of 1 to 500 micron. Suitable sheet metals include iron, cobalt, nickel, titanium and copper and alloys thereof, including stainless steels and low carbon steels.

Where the organometallic compound in the seed layer composition is of the preferred (low decomposition temperature) type described below, and all the other components have a similarly low decomposition temperature, the substrate may be a low melting glass, such as a soda glass.

In such a case the substrate may even be a high-melting plastic or a plastics composite, such as used in molded or conventional circuit boards.

The seed layer produced by firing a composition of the present invention on a substrate surface of any conventional material referred to above appears to bind well to such surface.

The preparation of the compounds and compositions of the present invention is described in the following Description and Examples, respectively.

Description 1

Silver neodecanoate (D.1)

Ammonia liquor (SG 0.88, 36 ml, 0.6 mole) was added dropwise to neodecanoic acid (95%, 103.2 g, 0.6 mole; Exxon purified by vacuum distillation) in ice-cooled distilled water (200 ml). The resulting ammonium neodecanoate soap was stirred at ambient temperature for 90 minutes, and then silver nitrate (101.94 g. 0.6 mole) in distilled water (120 ml) was added dropwise. The resultant white semi-solid was tritrated 4 times each with cold and warm (50° C.) distilled water, slurried in methanol (400 ml), filtered off and dried overnight at 40° C. under vacuum. Contains 30 wt% silver; yield 64% w.r.t. silver.

EXAMPLE 1

A seed layer composition (1) with the following components was made up as follows:

| (a) | Flux solution | g |
|---|---|---|
| | of | |
| | Bismuth carboxylate (Heraeus) | 0.5118 |
| | Rhodium carboxylate (Heraeus) | 0.0538 |
| | Chromium diketonete (Heraeus) | 0.0346 |
| | Silver sulphoresinate (Heraeus) | 0.1119; |
| | Tego Glide 100 (Tego Chemie) | 0.10 |
| | Byk 077 (Byk Chemie) | 0.10 |
| | Dichloromethane | 2.0 |
| (b) | Stock dye solution | 2.27 |
| | of | w/w |
| | Terpineol 318 (Hercules) | 19.8% |
| | Aromasol H (ICI) | 79.2% |
| | Dispersol Red (ICI) | 0.5% |
| | Dispersol Navy (ICI) | 0.5% |
| (c) | Gold tert-dodecylmercaptide (46% Au) | 8.523 |
| (d) | Stock resin solution | 13.30 |
| | of | w/w |
| | Ethyl cellulose N300 (Hercules) | 2.2% |
| | Cariflex BR 1202E | 15.4% |

|   |   |
|---|---|
| (butadiene-styrene copolymer) (Shell) | |
| Terpineol 318 (Hercules) | 17.2% |
| Aromasol H (ICI) | 65.2% |

(a) and (b) were combined and filtered, and all the dichloromethane was removed with hot air.

(c) was dissolved in the product with stirring. (d) was added, and the product was homogenized for 10 min with a mechanical stirrer.

Trace metal content pph gold:
Ag 2.0 Bi 1.5 Rh 0.3 Cr 0.15

EXAMPLE 2

Seed layer compositions with the following components was made up as follows:

|   |   | (2) | (3) | (4) | (5) |
|---|---|-----|-----|-----|-----|
| (a) | Flux solution of | g | g | g | g |
|   | Bismuth carboxylate (Heraeus) | 0.5118 | 0.5118 | 0.5118 | 0.5118 |
|   | Rhodium carboxylate (Heraeus) | 0.0538 | 0.0538 | 0.0538 | 0.0538 |
|   | Chromium diketonate (Heraeus) | 0.0346 | 0.0346 | 0.0346 | 0.0346 |
|   | Silver neodecanoate (D.1) 0.0987 | 0.05 | 0.05 | 0.05 | 0.05 |
|   | Tego Flow ZFS 460 (Tego Chemie) | | | | |
|   | Dichloromethane | 2.0 | 2.0 | 2.0 | 2.0 |
| (b) | Dye solution of | 2.0 | 2.0 | 2.0 | 2.0 |
|   | Terpineol 318 (Hercules) 19.8 parts | | | | |
|   | Aromasol H (ICI) 79.2 parts | | | | |
|   | Dispersal Red (ICI) 0.75 parts | | | | |
| (c) | Gold tert-dodecylmercaptide (46% Au) | 8.15 | 8.15 | 8.15 | 8.15 |
| (d) | Stock resin solution of | 14.09 | 13.89 w/w | 13.69 | 13.69 |
|   | Ethyl cellulose T200 (Hercules) | | 2% | | |
|   | Cariflex BR 1202E (butadiene-styrene copolymer) (Shell) | | 16% | | |
|   | Terpineol 318 (Hercules) | | 21% | | |
|   | Aromasol H (ICI) | | 61% | | |
|   | Trace metal content pph gold: | | | | |
|   | (2) Ag 0.81 Bi 1.5 Rh 0.3 Cr 0.14 | | | | |
|   | (3) Ag 2.43 Bi 1.5 Rh 0.3 Cr 0.14 | | | | |
|   | (4) Ag 4.05 Bi 1.5 Rh 0.3 Cr 0.14 | | | | |
|   | (5) Ag 5.0 Bi 1.5 Rh 0.3 Cr 0.14 | | | | |

EXAMPLE 3

A seed layer composition (6) with the following components was made up as follows:

|   | g |
|---|---|
| Gold resinate composition T18001X (Engelhard) | 19.6 |
| Silver resinate composition A2515 (Engelhard) | 0.4 |

The two components were mixed thoroughly on a glass plate with a spatula. On a larger scale they may be mixed in a mechanical mixer.

Trace metal content pph gold:
Ag 4.6 Bi 1.5 Rh 0.5 Cr 0.1
Sn, Pd, Pt < 0.03

In a third aspect the present invention provides a process for producing an essentially gold seed layer on a substrate, characterized by applying a layer of a composition of the present invention to the substrate and heating the coated substrate so as to convert the layer of composition to essentially gold. (It will be appreciated that the layer will also contain silver and generally also traces of metal from the above-mentioned gold fluxes).

In a fourth aspect the present invention provides a seed layer on a substrate when produced by the process of the third aspect of the invention.

It will be appreciated that the substrate in the present invention may be a single layer, so that the seed layer is the seed layer for a single-layer circuit. It may also be a substrate layer in a multilayer circuit, and it may thus have been produced by firing a dielectric composition over a circuit layer on a previous substance layer. The process of the third aspect of the present invention thus relates to the production both of a seed layer in a single layer circuit and of a seed layer in the top circuit layer of successive stages of a multilayer circuit. Such a latter circuit layer will thus be subsequently covered with a dielectric composition which will be fired to give the substrate for the next circuit layer.

The process of the third aspect of the invention and the product of the fourth aspect will now be described with reference to the attached drawings.

DETAILED DESCRIPTION OF THE DRAWING

Figure 1A:
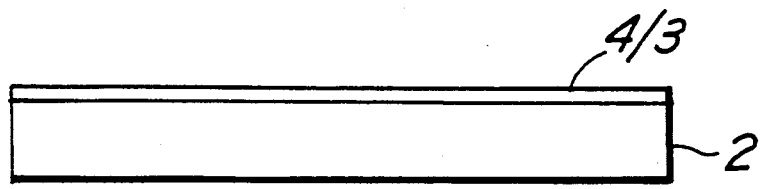
FIGS. 1 to 4 are sections through a circuit comprising the seed layer, at various stages of production.
Figure 1B:
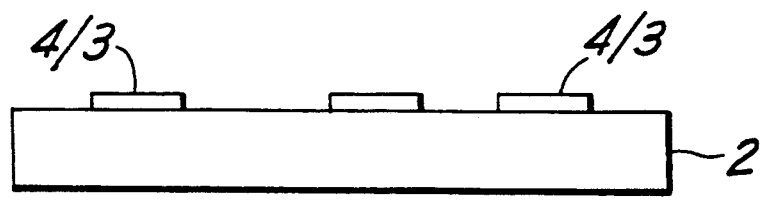

As shown in FIGS. 1a and 1b, the substrate 2, onto which a gold seed layer 4 is introduced, is typically of a high temperature and/or refractory material as described further hereinbefore, e.g., 96% pure alumina in the form of a flat rectangular plate, optionally with through-holes or cut-outs, e.g., a 100 mm×100 mm square plate, 0.5 to 1 mm thick.

As shown in FIGS. 1a and 1b, a seed layer 4, typically of gold, is introduced and bonded onto the surface of the substrate 2 by deposition onto the substrate 2 of a fluid precursor composition of the seed layer 4. A layer 3 of the composition on the substrate 2 is formed by a conventional printing, coating or other transfer method.

Deposition of the fluid precursor composition sufficient to give a final metal seed layer 4 at a loading of 0.1 to 2 mg/cm$^2$ is suitable for most purposes. A suitable loading of precursor composition layer 3, generally within the range of 0.4 to 30 mg/cm$^2$ to give this loading of seed layer 4 may readily be determined by the skilled man by routine trial and without undue experimentation.

In a first embodiment, shown in FIG. 1a, the precursor is applied as a continuous layer 3 covering the substrate 2 throughout, e.g., by screen printing, spraying, curtain or roller coating, or transfer application, and converted to a continuous sheet gold layer 4.

This layer 4 will be subsequently removed in part after the conductor tracks 8 have been applied to it to produce a seed layer under and corresponding to the desired final circuit conductor tack pattern 8.

In a second embodiment, shown in FIG. 1b, a gold seed layer 4 is laid down generally corresponding to the final conductor track pattern.

In one variant the precursor is applied in any desired pattern 3, e.g., by screen printing or decal or transfer application, usually corresponding to the desired final circuit.

In a second variant the precursor is applied as a continuous layer 3 covering the substrate 2 throughout as in embodiment 1a, e.g., by screen printing, spraying, curtain or roller coating, or transfer application, and converted to a continuous sheet gold layer 4. This layer 4 is subsequently removed in part before the conductor tracks 8 are applied to it to produce the patterned seed layer 4 corresponding to the desired final circuit conductor track pattern 8.

These two embodiments are, of course, two extreme cases; the process may often be a combination of features of both, i.e., the seed layer precursor 3 will be laid down and the seed layer 4 produced in a pattern corresponding to the final track pattern of that circuit layer with extra areas to provide electrical continuity over the whole pattern.

Such continuity may be needed for convenience in the subsequent plating of the tracks 8 onto the seed layer 4, but since it will not be needed in the final circuit layer, the surplus areas will be removed to give a seed layer pattern corresponding essentially to the circuit conductor track pattern.

Once the layer 3 of seed layer composition has been applied in either process embodiment, the coated substrate 2 is then fired conventionally at 400° to 1000° C.

On such firing the organogold and organosilver compounds in the precursor seed layer 3 decompose to release the gold and silver, the resin or polymer (optionally cures and) burns off, and the gold and silver fuse to form a solid, cohesive essentially gold seed layer 4, suitably at 0.1 to 2 mg/cm$^2$ for most purposes.

The firing is preferably carried out at towards 900° C., optionally first applying a dwell time at about 500° C.

As mentioned hereinbefore, some of the compositions may produce a seed layer at lower temperatures (e.g., in the range of 500° to 700° C., and may be suitable for use on lower melting or softening substrates. Suitable temperatures and heating profiles in such cases will be apparent to the skilled artisan.

In all cases, the coating and firing steps may be repeated as often as is desired.

In the second variant of the second (FIG. 1b) embodiment, the sheet gold seed layer 4 is then coated with light-hardening or solubilizing electrical resist 5 (not shown). The resist 5 is exposed to a light pattern corresponding respectively to a desired conductor pattern or to a negative of the pattern. The unhardened or solubilized parts of the resist 5 are then selectively dissolved with a conventional fluid to expose the seed layer 4 underneath selectively, defined by a resist corresponding to the desired pattern.

The seed layer 4 surface uncovered by the resist 5 is then attacked with an appropriate solvent for the seed layer, such as aromatic sulphonate/cyanide solution e.g., Superstrip 100 (Lea Ronal), potassium iodide/iodine solution, or Entreat 100 (Engelhard), to remove all of continuous seed layer 4 not covered by the resist 5.

This removal results in essentially the same product as in the first variant of the second embodiment.

Figure 3:
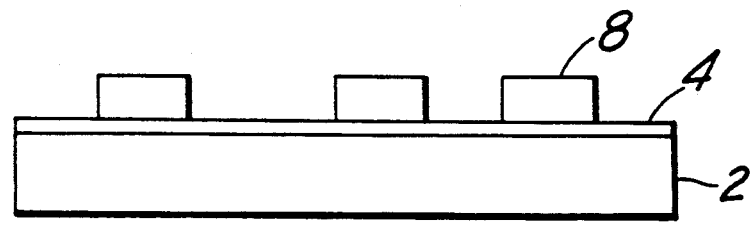
Figure 4:
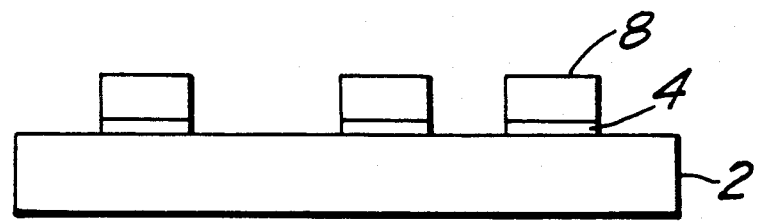

In both embodiments, referring to FIGS. 3 and 4, a conductor pattern 8 of a suitable metal (as mentioned hereinbefore), preferably copper or gold, is then formed on the seed layer.

The conductor pattern 8 may conveniently be formed in-situ, for example, by plating a pattern seed layer 4 shown in FIG. 1a, or by masking and plating of the sheet seed layer 4 shown in FIG. 1b. Although the ex-situ existing formation of a solid pattern and its application to the seed layer 4 is not excluded.

In in-situ formation of the conductor pattern 8 in both present embodiments, the seed layer 4 is then electroplated with solid copper to a thickness and width at all points well in excess of the thickness of the seed layer 4, for example 3 to 75 micron, in particular 5 to 20 micron, and in the desired conductor pattern 8.

Figure 2:
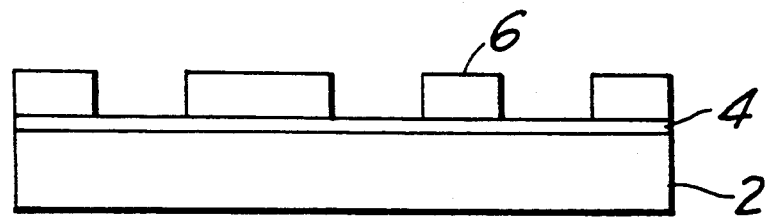

FIG. 2 shows the first step in the plating part of the process applied to the FIG. 1a embodiment.

In this embodiment the sheet gold layer 4 is first coated with light-hardening or solubilizing electrical resist generally to a thickness in the range of from 3 to 75 micron, but in any event preferably at least as thick as the intended thickness of the subsequently applied metal (e.g., copper) tracks.

The resist 6 is exposed to a light pattern corresponding respectively to a negative of a desired conductor pattern or the pattern itself. The unhardened or solubilized parts of the resist 6 are then selectively dissolved with a conventional fluid (see also FIG. 2).

This solution exposes the seed layer 4 underneath selectively, defined by a resist corresponding to a negative of the desired pattern.

After such partial removal of the resist 6 the product is conventionally electroplated or electrolessly plated.

In the first (FIG. 1a) present embodiment, the conductor pattern 8 may also be applied to the sheet seed layer 4 by other conventional means, such as by applying a fluid precursor pattern, e.g., by screen print or decal or transfer application, which is then converted to the desired solid conductor pattern 8.

However, in all cases, electroplated conductor patterns 8 are generally and advantageously denser and have better strength properties, primarily due to the increased cohesiveness of the layer so applied, compared with, e.g., screen printed conductor patterns 8.

In a process modification, high definition tracks are produced by masking and plating, followed by a repeat of these steps to produce broader tracks or areas for connections, e.g., by substrate through holes.

In the second (FIG. 1b) present embodiment, the desired plating pattern is already provided by the seed layer 4 pattern, and therefore does not require the foregoing resist processing steps, that is, the seed layer 4 shown in FIG. 1b may be plated directly, or (less usually) the conductor pattern may be applied as above.

The result of the plating process (or other process for applying the conductor pattern 8) and any necessary removal of a resist is (as shown in FIGS. 3 and 4) a thick conductor pattern 8 is built up on a thin seed layer 4, respectively as a continuous sheet or in a pattern corresponding to the conductor pattern.

In the first embodiment of the invention, the seed layer 4 surface not covered by and adhering to the conductor pattern 8 is then attacked with an appropriate solvent for the seed layer, such as aromatic sulphonate/cyanide solution, e.g., Superstrip 100 (Lea Ronal), potassium iodide/iodine solution, and Entreat 100 (Engelhard). The solvent removes all of the continuous seed layer 4 not covered by the conductor pattern 8, resulting in essentially the same product as that of the direct plating in the second embodiment.

It will be appreciated that, in an alternative, gold tracks may be plated onto a gold seed layer. The skilled artisan will appreciate that the first embodiment of the process may still be used, but that it will be necessary to protect the gold tracks 8 conventionally in any removal of the gold seed layer 4 as described immediately above.

In a further modification of the described method (not shown), the seed layer is applied in a pattern of (usually) rectangular windows in an otherwise generally continuous layer.

In such a modification, a thick film resistor composition is then conventionally applied across each window (e.g., by screen printing) to overlap the seed layer at a pair of opposing sides, and is fired to form a resistor. The conductor tracks 8 are then applied as described hereinbefore. The skilled artisan will appreciate that it may be necessary to protect the resistor conventionally during any plating process.

As noted hereinbefore, the circuit produced by the present invention may be a circuit layer in a multilayer circuit. Such a circuit layer will thus be subsequently covered with a dielectric composition which will be fired to give the substrate 12 for the next circuit layer.

In one modification of product circuit (not shown), the copper pattern 8 is coated at least on its upper surface with a film 9 of metal which will inhibit the diffusion of oxygen into, and oxidation of, the conductor pattern 8 during any subsequent firing which may (typically) be carried out in air. This film 9 may be nickel, palladium, gold, silver, chromium, rhodium, or any alloy thereof. This film 9 is particularly useful in areas where the (oxidizable) copper is exposed to air, e.g., in or by through holes or vias between adjacent layers in the multilayer circuit.

In yet a further modification (also not shown), the film 9 is coated with a thin film of copper to be oxidized and act as an adhesion layer between the film 9 and the fired dielectric 12 applied in the subsequent process.

TEST EXAMPLES

Copper conductors laid down as described above on seed layers of the present invention on 96% pure alumina were subjected to a modified version of the pull peel test method described in the DuPont test bulletin A-74672. The modification used was to dip solder the 2 mm × 2 mm copper pads described in the bulletin and to hand solder individual wires to each pad, rather than to rows of pads. The conductors were tested as formed initially and after accelerated aging at 150° C., 165° C. and/or 175° C. for 1000 hr. In the case of aging at 150° C., the wires were soldered to the pads before aging; at 165° C. and 175° C., the conductors were aged and mechanically cleaned, and then the wires were soldered to the pads. The following results were obtained, fracture occurring in the substrate or at the seed layer - substrate interface in all cases:

| Composition | Yield stress average values. kg, | | | |
|---|---|---|---|---|
| | Initial | 1000 hr | | |
| | | 150° C. | 165° C. | 175° C. |
| (1) | 5.4 | 3.9 | 3.2 | 2.1 |
| (2) | 5.9 | 4.1 | 5.0 | 2.3 |
| (3) | 5.3 | 2.7 | 3.1 | 1.3 |
| (4) | 4.6 | 3.1 | 1.7 | 1.1 |
| (5) | 4.2 | 2.4 | 2.0 | 0.9 |
| (6) | 4.5 | 3.9 | 3.5 | |

All values were found to be substantially better than corresponding values for corresponding and related compositions without comparable levels of added silver.

We claim:

1. A fluid composition suitable for coating a substrate and producing a gold seed layer thereon by firing the coated substrate to thermally decompose the fluid composition said fluid composition comprising an organogold compound, a resin and an organosilver compound present in an amount equal to 0.5 to 10 parts by weight silver per 100 parts by weight gold.

2. A fluid composition according to claim 1, wherein the organosilver compound is present in an amount equal to 0.8 to 6 parts by weight silver per 100 parts by weight gold.

3. A fluid composition according to claim 1, wherein the organogold and organosilver compounds have thermal decomposition temperatures 100° to 350° C. below the decomposition temperature of the resin.

4. A fluid composition according to claim 3, wherein the organogold and organosilver compounds have thermal decomposition temperatures at least 200° C. below the decomposition temperature of the resin.

5. A fluid composition according to claim 4, wherein the organogold and organosilver compounds have thermal decomposition temperatures at least 250° C. below the decomposition temperature of the resin.

6. A fluid composition according to claim 1, wherein the organosilver compounds are selected from the group consisting of silver sulphoresinates, silver terpene sulphides, aryl mercaptides of silver, and silver alkanoates.

7. A fluid composition according to claim 6, wherein the organosilver compound is a silver alkanoate and the alkanoate comprises tertiary alkanoates containing eight to sixteen carbon atoms and mixtures thereof.

8. A fluid composition according to claim 7, wherein the silver alkanoate is silver neodecanoate.

9. A fluid composition according to claim 1, wherein the organometallic gold compound is a gold tert.-dodecylmercaptide.

10. A fluid composition according to claim 1, further comprising a fluid vehicle selected from the group consisting of xylene, high boiling petroleum fractions, substituted aromatics, terpenes, alcohols, glycol ethers, esters, glycol ether esters and compatible mixtures thereof.

* * * * *